(12) United States Patent
Matsumoto et al.

(10) Patent No.: US 11,677,062 B2
(45) Date of Patent: Jun. 13, 2023

(54) METHOD OF MANUFACTURING LIGHT SOURCE DEVICE HAVING A BONDING LAYER WITH BUMPS AND A BONDING MEMBER

(71) Applicant: NICHIA CORPORATION, Anan (JP)

(72) Inventors: Takashi Matsumoto, Itano-gun (JP); Naoki Harada, Tokushima (JP); Fukutaro Saegusa, Anan (JP); Yoshiyuki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 114 days.

(21) Appl. No.: 16/724,995

(22) Filed: Dec. 23, 2019

(65) Prior Publication Data
US 2020/0203589 A1   Jun. 25, 2020

(30) Foreign Application Priority Data

Dec. 25, 2018 (JP) .............................. JP2018-240933
Jun. 13, 2019 (JP) .............................. JP2019-110484

(51) Int. Cl.
*H01L 33/64* (2010.01)
*H01L 33/00* (2010.01)
(Continued)

(52) U.S. Cl.
CPC ........ *H01L 33/641* (2013.01); *H01L 33/0095* (2013.01); *H01L 33/642* (2013.01);
(Continued)

(58) Field of Classification Search
CPC ............. H01L 33/62; H01L 33/64–641; H01L 33/641; H01L 33/647; H01L 33/0095; H01L 33/642; H01L 2933/0075; H01L 24/29; H01L 2224/26165; H01L 2224/27436; H01L 2224/29144; H01L 2224/2929; H01L 2224/29339; H01L 2224/29344; H01L 2224/29347; H01L 2224/32245; H01L 2224/8314; H01L 2224/83192; H01L 2224/83815; H01L 2224/8384; H01L 2224/83862; H01L 2224/83905; H01L 2224/94; H01L 24/32;
(Continued)

(56) References Cited

U.S. PATENT DOCUMENTS

2014/0001617 A1   1/2014   Shi et al.
2014/0217450 A1   8/2014   Ishigami et al.
(Continued)

FOREIGN PATENT DOCUMENTS

EP   1916712 A2   4/2008
EP   3051598 A1   8/2016
(Continued)

*Primary Examiner* — Patricia D Valenzuela
(74) *Attorney, Agent, or Firm* — Birch, Stewart, Kolasch & Birch, LLP (57) ABSTRACT

A method of manufacturing a light source device includes: disposing bumps containing a first metal on a first substrate which is thermally conductive; disposing a bonding member on the bumps, the bonding member containing Au—Sn alloy; disposing a light emitting element on the bumps and the bonding member; and heating the first substrate equipped with the bumps, the bonding member, and the light emitting element.

7 Claims, 10 Drawing Sheets

(51) Int. Cl.
 *H01L 23/00* (2006.01)
 *H01L 33/62* (2010.01)
(52) U.S. Cl.
 CPC .............. *H01L 24/00* (2013.01); *H01L 33/62* (2013.01); *H01L 33/647* (2013.01); *H01L 2933/0075* (2013.01)
(58) Field of Classification Search
 CPC . H01L 24/83; H01L 33/48; H01L 2933/0033; H01L 2933/0066; H01L 33/00–648
 See application file for complete search history.

(56) References Cited

U.S. PATENT DOCUMENTS

| | | | | |
|---|---|---|---|---|
| 2015/0102483 | A1* | 4/2015 | Zhang | H01L 23/49811 257/737 |
| 2015/0217411 | A1 | 8/2015 | Ishikawa et al. | |
| 2016/0042902 | A1* | 2/2016 | Zeyen | H01H 59/0009 216/18 |
| 2016/0089752 | A1* | 3/2016 | Iseki | B23K 35/3013 428/672 |
| 2016/0093786 | A1 | 3/2016 | Hosotani | |
| 2016/0204313 | A1 | 7/2016 | Namiki et al. | |
| 2016/0284952 | A1 | 9/2016 | Takeda | |
| 2017/0154880 | A1* | 6/2017 | Ozeki | H01L 25/167 |
| 2019/0189881 | A1* | 6/2019 | Kawabata | H01L 33/647 |

FOREIGN PATENT DOCUMENTS

| | | |
|---|---|---|
| JP | 2005-129886 A | 5/2005 |
| JP | 2007-194383 A | 8/2007 |
| JP | 2009-54893 A | 3/2009 |
| JP | 2010-135503 A | 6/2010 |
| JP | 2011-228604 A | 11/2011 |
| JP | 2013-82784 A | 5/2013 |
| JP | 2014-99584 A | 5/2014 |
| JP | 2015-12006 A | 1/2015 |
| JP | 2015-88744 A | 5/2015 |
| JP | 2015-185611 A | 10/2015 |
| JP | 2015-185685 A | 10/2015 |
| JP | 2016-184714 A | 10/2016 |
| JP | 2017-135301 A | 8/2017 |
| JP | 2018-32761 A | 3/2018 |
| WO | WO 2014/038331 A1 | 3/2014 |
| WO | WO 2017/217369 A1 | 12/2017 |

\* cited by examiner

METHOD OF MANUFACTURING LIGHT SOURCE DEVICE HAVING A BONDING LAYER WITH BUMPS AND A BONDING MEMBER

CROSS-REFERENCE TO RELATED APPLICATION

This application claims priority to Japanese Patent Application No. 2018-240933 filed on Dec. 25, 2018, and Japanese Patent Application No. 2019-110484 filed on Jun. 13, 2019, the disclosures of which are hereby incorporated by reference in their entireties.

BACKGROUND

The present disclosure relates to a method of manufacturing a light source device and a light source device.

Application of semiconductor light emitting elements (Light Emitting Diodes, LEDs) widely increases in industry or automotive field due to the improvement of functions and performance thereof.

In practical applications, how to deal with heat associated with higher luminance light emitting element must be sufficiently taken into consideration. There has been considered to provide a module substrate functioning also as a heat sink and mount LEDs on the module substrate, to realize high heat dissipation.

In the case in which LEDs are mounted on a module substrate, bonding strength must be established. That is, it is necessary to inhibit damage or breakage of a bonding member due to stress attributed to the difference in linear expansion coefficient between the module substrate and a mounting substrate on which the LEDs are mounted (for example, see Japanese Patent Publication No. 2015-185685 and Japanese Patent Publication No. 2010-135503).

The present disclosure can provide a method of manufacturing a light source device with improved bonding strength between a light emitting element and a module substrate, and a light source device therewith.

SUMMARY

A method of manufacturing a light source device according to certain embodiment includes: disposing bumps containing a first metal on a first substrate which is thermally conductive; disposing a bonding member on the bumps, the bonding member containing Au—Sn alloy; disposing a light emitting element on the bumps and the bonding member; and heating the first substrate equipped with the bumps, the bonding member, and the light emitting element.

A method of manufacturing a light source device according to certain embodiment includes: disposing a bonding member on a first substrate which is thermally conductive, the second metal containing a second metal; disposing a light emitting element on the bonding member, the light emitting element being provided with bumps containing a first metal of which melting point is equal to or higher than a melting point of the second metal; and heating the first substrate equipped with the light emitting element equipped with the bonding member and the bumps at a temperature equal to or lower than the melting point of the first metal.

A method of manufacturing a light source device according to certain embodiment includes: disposing a bonding member on a first substrate which is thermally conductive, the second metal containing a second metal; disposing a light emitting element on the bonding member, the light emitting element being provided with bumps containing a first metal of which melting point is equal to or higher than a melting point of the second metal; and heating the first substrate equipped with the light emitting element equipped with the bonding member and the bumps at a temperature equal to or lower than the melting point of the first metal.

A method of manufacturing a light source device according to certain embodiment includes: disposing bumps on a first substrate which is thermally conductive, the bumps containing a first metal; disposing a bonding member on the bumps, the bonding member containing a second metal; disposing a light emitting element on the bumps and the bonding member; and heating the first substrate equipped with the bumps, the bonding member, and the light emitting element in order to sinter the second metal.

A light source device according to certain embodiment includes: a first substrate which is thermally conductive; a light emitting element; and a bonding layer provided between the first substrate and the light emitting element. The bonding layer includes a first portion containing Ag, and a second portion containing Au—Sn alloy.

A light source device according to certain embodiment includes: a first substrate which is thermally conductive; a light emitting element; and a bonding layer provided between the first substrate and the light emitting element. The bonding layer is formed using alloy containing Ag, Au, and Sn, and includes a portion where Ag is higher in concentration than Au or Sn, and a portion where Ag is lower in concentration than Au or Sn.

A light source device according to certain embodiment includes: a first substrate which is thermally conductive; a light emitting element; and a bonding layer provided between the first substrate and the light emitting element. The bonding layer includes a third portion containing a first metal, and a fourth portion including a sintered body of a second metal.

The present embodiments can provide the method of manufacturing a light source device with improved bonding strength between a light emitting element and a module substrate, and the light source device therewith.

DETAILED DESCRIPTION OF EMBODIMENTS

In the following, a description will be given of embodiments of the present disclosure with reference to the drawings.

The drawings are of schematic or conceptual nature. Therefore, the relationship between the thickness and width of any component, the proportion in size among any parts may not coincide with the actual scale. One portion of a component can be illustrated differently in size or proportion depending on the drawings.

In the description and the drawings, an element which has been previously described with reference numeral to any drawing can be denoted by an identical reference numeral, and the detailed description thereof will not be repeated.

First Embodiment

Figure 1A:
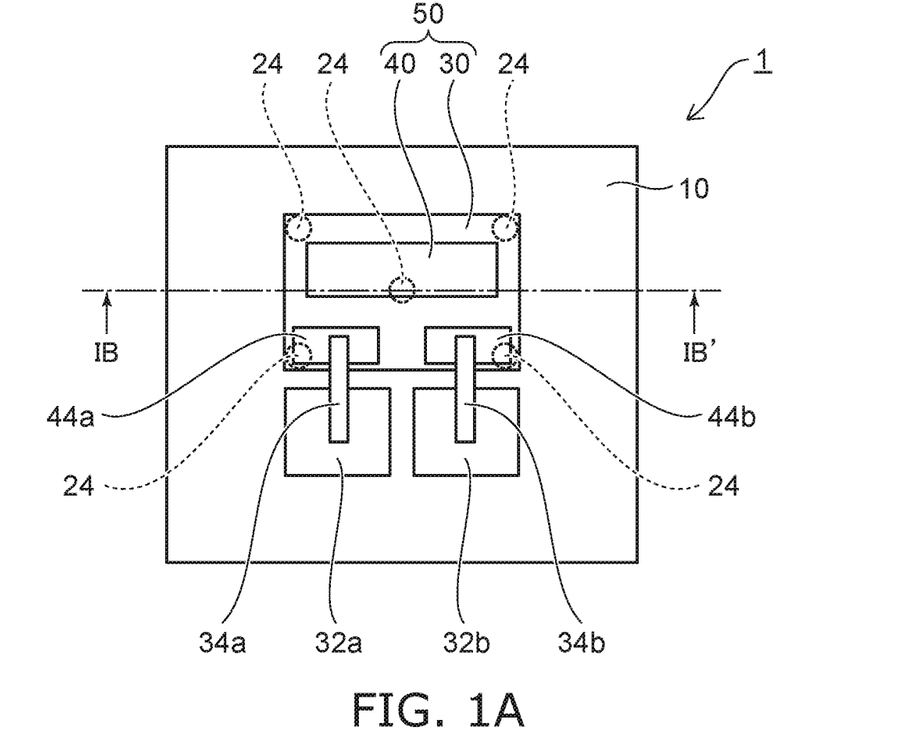
FIG. 1A is a schematic top view exemplarily showing a light source module according to a first embodiment.

FIG. 1A is a schematic top view exemplarily showing a light source module according to the present embodiment.

Figure 1B:
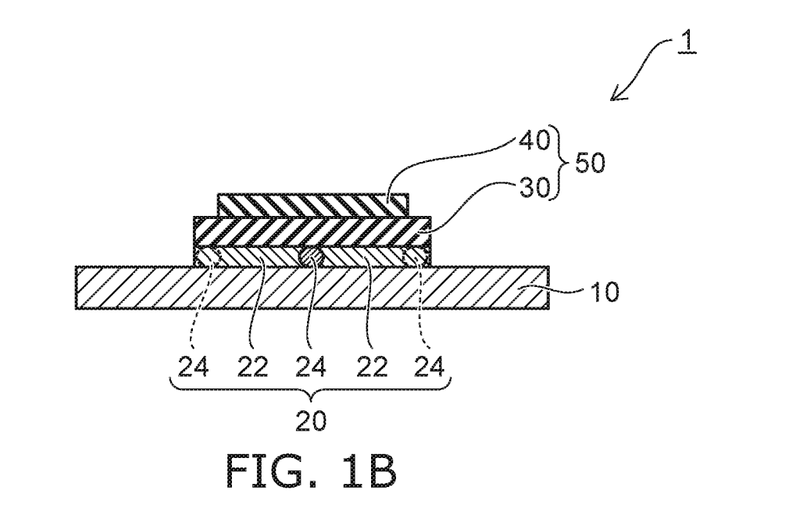
FIG. 1B is a schematic cross-sectional view taken along line IB-IB' in FIG. 1A.

FIG. 1B is a schematic cross-sectional view taken along line IB-IB' in FIG. 1A.

As shown in FIGS. 1A and 1B, a light source module (i.e., light source device) 1 according to the present embodiment includes a module substrate 10, a bonding layer 20, and a light emitting module 50. The bonding layer 20 is provided between the module substrate 10 and the light emitting module 50. The light emitting module 50 includes a mounting substrate 30 and a light emitting element 40, and bonded to the module substrate 10 with the bonding layer 20.

The bonding layer 20 includes a bonding member 22 and bumps 24. The bumps 24 contain a first metal. The first metal is formed using, for example, Ag. The bonding member 22 contains a second metal. The second metal is, for example, Au—Sn alloy. Preferably, the Au—Sn alloy contains Au by a content in a range of 70 wt % to 85 wt % and Sn by a content in a range of 15 wt % to 30 wt %, particularly preferably, Au by a content of about 80 wt % and Sn by a content of about 20 wt %. Setting Au—Sn alloy of a predetermined weight percent, a melting point far lower than the melting point of the metal materials (Ag, Cu and the like) of the bumps 24 is attained.

The bumps (i.e., a first portion) 24 are preferably disposed near the outer edge of the bonding member 22 and the center of the bonding member 22, and more preferably positioned at the corners and the intersection point of diagonals of the bonding member as seen in a top view. In FIG. 1A, five bumps 24 are disposed between the module substrate 10 and the mounting substrate 30, however, the bumps 24 can be provided at four portions or six or more portions. The area of the portions where the bumps 24 are provided as seen in a top view is preferably 10% or less as great as the area of the mounting substrate 30. This structure can ensure bonding strength while reducing the costs.

The height of the bumps 24 is set to a proper dimension according to the thickness of the bonding layer 20. The bumps 24 are preferably ball bumps which are ball-like shape or spherical shape. The bumps 24 can have other shape such as cylindrical shape, instead of balls. The height of the bumps 24 preferably is in a range of 35 μm to 50 μm. The diameter of each of the bumps 24 as seen in a top view can be about 70 μm.

The bumps 24 are sufficiently higher in melting point than the bonding member 22. The bumps 24 are preferably formed using a material not easily alloyed in the case in which the space between the bumps 24 is filled with melted bonding member 22. As described above, the bumps 24 contain Ag, for example. The melting point of Ag is 962° C., which is higher than that of Au—Sn alloy. Materials other than Ag can be used so long as their melting points are higher than that of Au—Sn alloy. The material is preferably metal.

The bonding member (i.e., a second portion) 22 is provided to fill the space between the module substrate 10 and the mounting substrate 30, in the space between the module substrate 10 and the bumps 24, and in the space between the bumps 24 and the mounting substrate 30. Accordingly, the bonding layer 20 entirely fills the space between the module substrate 10 and the mounting substrate 30.

The bonding member 22 filling the space among the module substrate 10, the mounting substrate 30, and the bumps 24 can reduce thermal resistance between the module substrate 10 and the mounting substrate 30 and, can improve heat dissipation of the light source module 1.

The bonding member 22 filling the space among the module substrate 10, the mounting substrate 30, and the bumps 24 can inhibit occurrence of cracks in the bonding member 22 attributed to application of thermal stress when the product is in use.

The bonding member 22 has high thermal conductivity and the melting point sufficiently higher than the operating temperature range and the storage temperature range of the light source module 1. For example, a bonding member containing Au—Sn alloy such as Au—Sn eutectic solder is preferable, for its good thermal conductivity and thermal fatigue resistance.

When the bonding member 22 is Au—Sn alloy, the thickness of the bonding layer 20 is preferably 35 µm or more. The bonding layer 20 having 35 µm or more of thickness can provide the sufficient bonding strength to withstand the temperature cycle test condition of −40° C. to +125° C. which is required in industrial or automotive applications.

The bonding layer 20 bonds between the module substrate 10 formed using metal and the mounting substrate 30 being insulative. The bonding layer 20 contains Au—Sn and has a sufficient thickness. Therefore, the bonding layer 20 maintains the bonding state with less occurrence of cracks due to stress attributed to the difference in coefficient of linear expansion between the two substrates.

The module substrate (i.e., a first substrate) 10 is a plate-like member which has high thermal conductivity. The area and thickness of the module substrate 10 are set as appropriate according to heat generated by the light emitting module 50 mounted thereon and the temperature of the environment in which the light source module 1 is used. The module substrate 10 is a plate member formed using metal containing Cu or alloy of Cu, for example.

On the mounting substrate (i.e., second substrate) 30, the light emitting element 40 is mounted to thereby form the light emitting module 50. The light emitting element 40 is fixed on the mounting substrate 30 by using a bonding member which is not shown such as, for example, an adhesive agent. The mounted light emitting element 40 is not specified, and can include GaN, AlGaAs, GaAsP, InGaN or the like. The color of emitted light is not specified also, and can be visible light, infrared rays, ultraviolet rays or the like.

The mounting substrate 30 includes connection terminals 44a, 44b for connecting the light emitting element 40 on the surface where the light emitting element 40 mounted. The mounting substrate 30 can include wirings for connecting between the light emitting element 40 and other circuit element. The mounting substrate 30 can have the shape and dimensions capable of mounting the light emitting element 40 and the anode- and cathode-connection terminals 44a, 44b for the light emitting element 40. In this example, the mounting substrate 30 is a substantially quadrangular plate-like member including the area for mounting the rectangular prism-shaped light emitting element 40 and two rectangular connection terminals 44a, 44b. The dimensions of the mounting substrate 30 are set to be smaller than that of the module substrate 10.

The module substrate 10 is bonded on the other surface of the mounting substrate 30 via the bonding layer 20. The mounting substrate 30 is, for example, a ceramic substrate, and contains AlN, $Al_2O_3$, mullite or the like.

The anode-side connection terminal 44a of the mounting substrate 30 is connected to one end of an anode-side connection wiring 34a. Other end of the connection wiring 34a is connected to an anode-side external connection terminal 32a of the module substrate 10. The cathode-side connection terminal 44b of the mounting substrate 30 is connected to one end of a cathode-side connection wiring 34b. Other end of the connection wiring 34b is connected to a cathode-side external connection terminal 32b of the module substrate 10. Electricity is supplied to the light source module 1 from outside via the external connection terminals 32a, 32b, whereby the light emitting element 40 emits light.

In the light source module 1, the light emitting module 50 is mounted on the module substrate 10 which has high thermal conductivity. Therefore, the light source module 1 exhibits high heat dissipation.

In the case in which the light source module 1 manufactured in the above-described manner is in actual use and receives thermal stress, alloying can be progress between the bonding member 22 and the bumps 24 in the bonding layer 20. For example, in the case in which the bumps 24 are configure as Ag bumps, Ag may be diffused into the bonding member 22 and the bumps may be deformed from the original shape. That is, the bonding layer 20 is the layer including a portion where Ag is higher than Au or Sn in concentration and a portion where Ag is lower than Au or Sn in concentration.

A description will be given of a method of manufacturing the light source module 1 according to the present embodiment.

FIGS. 2A to 2D are each a schematic cross-sectional view exemplarily showing the method of manufacturing the light source module according to the present embodiment.

Figure 2A:
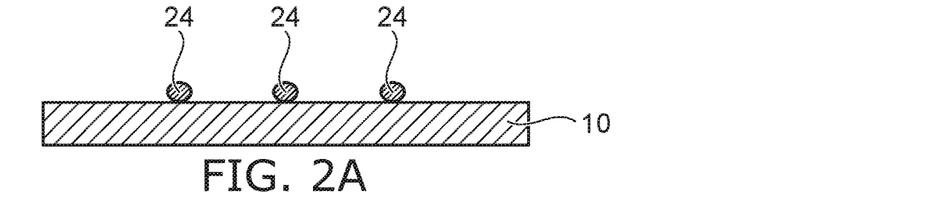
FIG. 2A is a schematic cross-sectional view exemplarily showing a method of manufacturing the light source module according to the first embodiment.

As shown in FIG. 2A, the bumps 24 are formed on the module substrate 10. In the following, a description will be given of the manufacturing method in which the bumps 24 are formed at the four corners and the intersection point of diagonals of the mounting substrate 30 as seen in a top view. The height of the bumps 24 preferably is in a range of 35 µm to 50 µm inclusive when the bonding layer 20 has a thickness of 35 µm or more.

The bumps 24 has sufficiently higher melting point than that of an Au—Sn foil 22a. The melting point of the bumps 24 is preferably 50° C. or more. The bumps 24 are preferably made of metal in order to have high thermal conductivity. Also, when the Au—Sn foil 22a is melted, desirably the Au—Sn foil 22a does not easily alloyed with Au—Sn eutectic alloy. Ag is known to have a melting point of about 962° C. and to be hardly alloyed with Au—Sn eutectic alloy. Thus, Ag is preferably contained in the material of the bumps 24.

Figure 2B:
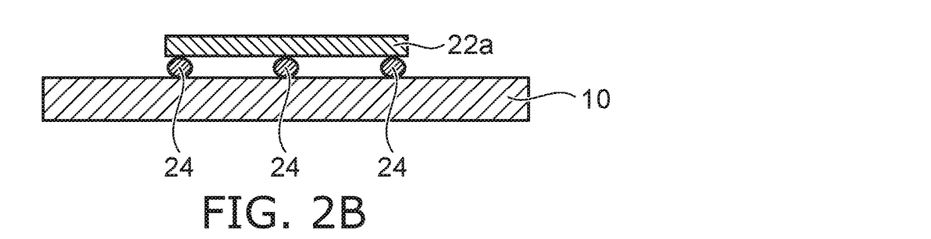
FIG. 2B is a schematic cross-sectional view exemplarily showing the method of manufacturing the light source module according to the first embodiment.

As shown in FIG. 2B, the Au—Sn foil (i.e., the bonding member) 22a is disposed on the bumps 24. Although not shown in FIG. 2B, five bumps 24 are disposed on the module substrate 10. The shape and dimensions of the Au—Sn foil 22a as seen in a top view are set to be substantially identical to the shape and dimensions of the mounting substrate 30 as seen in a top view. The Au—Sn foil 22a is disposed having its four corners aligned with the bumps 24 disposed at the four corners of a quadrangular shape as seen in a top view.

The bumps 24 are disposed such that the Au—Sn foil 22a does not flows out over the outer edge of the mounting substrate 30 when the Au—Sn foil 22a is melted. Without being specified to such a disposition, for example, the bumps 24 can be disposed by any number and any positions along the outer edge of the Au—Sn foil 22a which has an identical shape and dimensions to the mounting substrate 30 as seen in a top view.

Figure 2C:
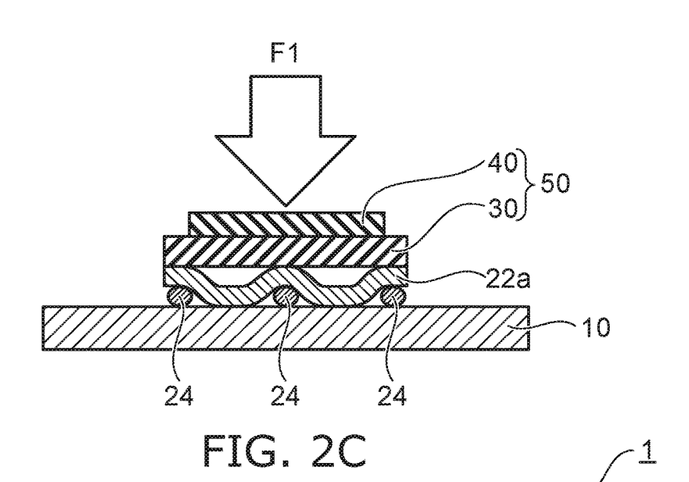
FIG. 2C is a schematic cross-sectional view exemplarily showing the method of manufacturing the light source module according to the first embodiment.

As shown in FIG. 2C, the light emitting module 50 in which the light emitting element 40 is mounted on the mounting substrate 30 is mounted having the four corners of the mounting substrate 30 aligned with the four corners of the Au—Sn foil 22a as seen in a top view. While pressure F1 is applied from the top of the light emitting module 50, heat is applied to the whole structure at a temperature equal to or higher than the melting point of the Au—Sn foil 22a and sufficiently lower than the melting point of the bumps 24. The melting point of the Au—Sn foil 22a is changed depending on the composition of the Au—Sn eutectic alloy of the Au—Sn foil 22a. For example, the set heating temperature is preferably 280° C. or more, for example, 350° C. or less, when the Au—Sn eutectic alloy is composed of 20 wt % of Sn and the bumps 24 contain Ag of which melting point is 962° C.

By heating the Au—Sn foil 22a to the melting point or higher, the Au—Sn foil 22a is melted and fills the space around the bumps 24 and between the light emitting module 50 and the Au—Sn foil 22a. The pressure F1 is set to the value sufficient to push put the air in the space existing around the bumps 24 and between the light emitting module 50 and the Au—Sn foil 22a as a result of the melting of the Au—Sn foil 22a. Application of pressure F1 when the Au—Sn foil 22a is melted can inhibit generation of voids when the Au—Sn alloy solidifies.

Figure 2D:
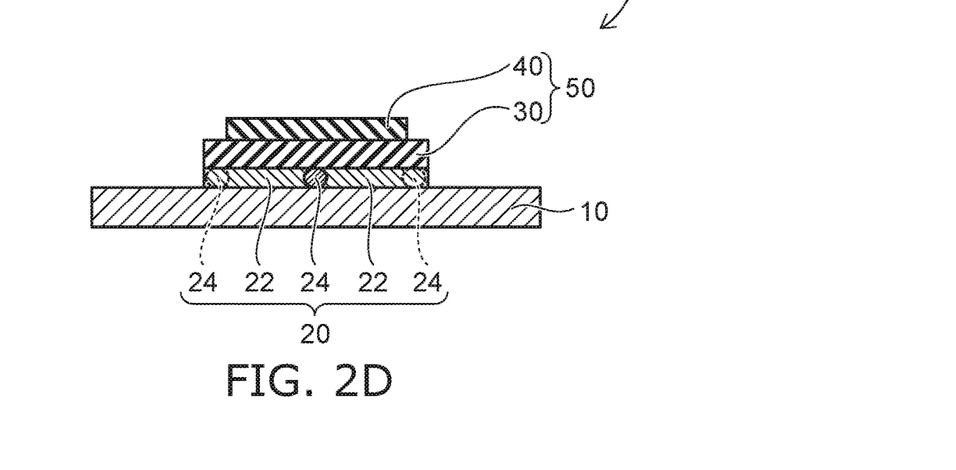
FIG. 2D is a schematic cross-sectional view exemplarily showing the method of manufacturing the light source module according to the first embodiment.

As shown in FIG. 2D, the module substrate 10, the bonding member 22, the bumps 24, and the light emitting module 50 are cooled to form the bonding layer 20, whereby the module substrate 10 and the light emitting module 50 are connected to each other.

Alternatively, the module substrate 10 and the mounting substrate 30 can be previously bonded to each other, and the light emitting element 40 can be connected to the mounting substrate 30. In this case, when a thermosetting adhesive agent is used to bond the mounting substrate 30 and the light emitting element 40, an adhesive agent which solidifies at a temperature sufficiently lower than the melting point of the Au—Sn alloy, for example, an epoxy-based adhesive agent, is used because the bonding layer 20 contains Au—Sn alloy.

In the light source module 1 according to the present embodiment, the bonding layer 20 containing Au—Sn alloy is used to bond the module substrate 10 and the light emitting module 50 to each other. In order to improve the heat dissipation of the light source module 1, the module substrate 10 is formed using metal plate member. When the metal plate member is composed of Cu, its coefficient of linear expansion is about $16.8 \times 10^{-6}$ [$K^{-1}$]. On the other hand, the mounting substrate is an insulating member such as AlN on which the wirings and the connection terminals are to be provided. The coefficient of linear expansion of AlN is about $5 \times 10^{-6}$ [$K^{-1}$]. That is, the module substrate 10 and the mounting substrate 30 are different from each other in coefficient of linear expansion by more than three times. Thus, great stress is applied to the bonding layer 20 when thermal stress is applied in a temperature cycle test or the like. The bonding layer 20 should have bonding strength sufficient to inhibit occurrence of cracks in an industrial device application where the operating temperature range and the environmental temperature range are wide from low temperatures to high temperatures.

In the light source module 1 according to the present embodiment, the bonding layer 20 is provided with a sufficient thickness by virtue of the bumps 24 being provided between the module substrate 10 and the light emitting module 50. Accordingly, thermal stress between the module substrate 10 and the light emitting module 50 may be absorbed, and the bonding strength between the module substrate 10 and the light emitting module 50 may sufficiently be enhanced.

In the method of manufacturing the light source module 1 according to the present embodiment, the bumps 24 are previously formed at the position where the Au—Sn foil 22a is disposed. This allows the Au—Sn foil 22a and the light emitting module 50 to be precisely disposed.

The bumps 24 are formed of a metal material of which melting point is sufficiently higher than that of the Au—Sn foil 22a, for example, a metal material containing Ag. Accordingly, when the Au—Sn foil 22a is melted, the wettability of the bumps 24 by the melted Au—Sn eutectic alloy and the friction force between the melted Au—Sn eutectic alloy and the bumps can inhibit the melted Au—Sn eutectic alloy from flowing out from the positions where the bumps 24 are disposed. The thickness of the bonding layer 20 is maintained to be equal to or greater than the height of the bumps. Thus, setting a proper height of the bumps 24 can provide a desired thickness of the bonding layer 20.

The bumps 24 formed using Ag bumps having a height in a range of 35 μm to 50 μm allows the bonding layer 20 to have 35 μm or more of thickness. The bonding layer 20 having 35 μm or more of thickness can have a resistance to 3,000 cycles of the temperature cycle test at the temperature in a range of −40° C. to +125° C. The temperature cycle test is performed in accordance with the standards such as, for example, JEDEC (Joint Electron Device Engineering Council), IEC (International Electrotechnical Commission), or AEC (Automotive Electronics Council).

In the method of manufacturing the light source module 1 according to the present embodiment, the bumps 24 are provided at the intersection point of diagonals of the Au—Sn foil 22a in addition to the four corners of the Au—Sn foil 22a. Thus, even if one of the five bumps fails to meet the height requirement, the light emitting module 50 can be mounted in a state in which the upper surface of the light emitting module 50 will not largely tilt relative to the bottom surface of the module substrate 10.

In the foregoing, the description has been given of use of the Au—Sn foil 22a containing Au—Sn eutectic alloy as the bonding member 22, when the light source module is used in the temperature range required for industrial devices or automotive devices. Depending on the use temperature range of the light source module such as operation temperature range and environmental temperature range, different thickness or material can be employed for the bonding member. For example, when the light source module is used in a narrower temperature range, the thickness of the Au—Sn foil can be thin and the height of the bumps can be lowered in accordance with the Au—Sn foil thickness. When the light source module is used in a further narrower temperature range, alloy of which melting point is lower than Au—Sn eutectic alloy can be employed with the bumps containing metal of which melting point is sufficiently higher than that of the alloy.

Second Embodiment

In an embodiment described below, light emitting elements are directly disposed on metal bumps and a bonding member containing metal, and can be mounted on a mounting substrate at high precision. Thus, the size of the light emitting module may further be reduced.

Figure 3A:
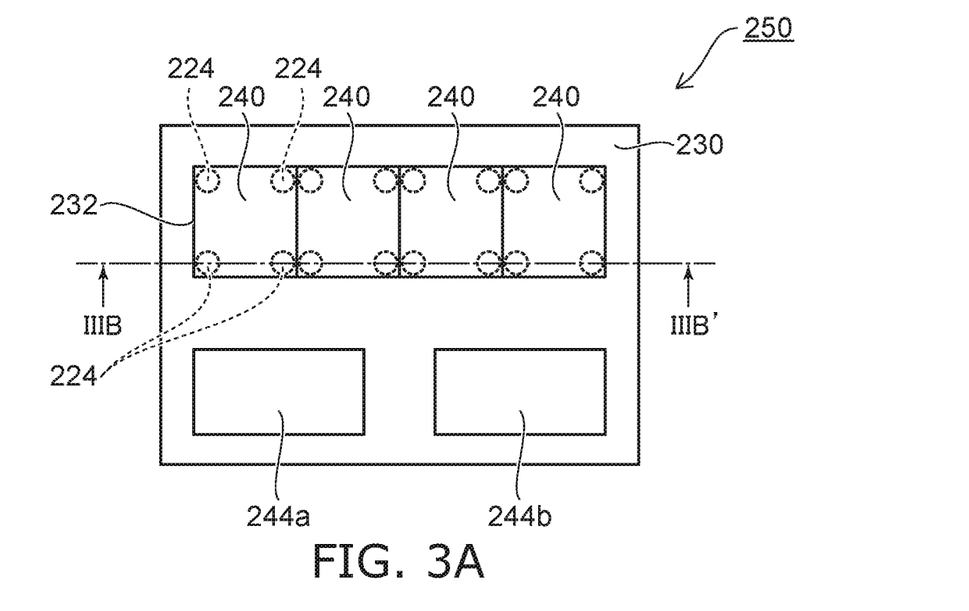
FIG. 3A is a schematic top view exemplarily showing a light emitting module according to a second embodiment.

FIG. 3A is a schematic top view exemplarily showing a light emitting module according to the present embodiment.

Figure 3B:
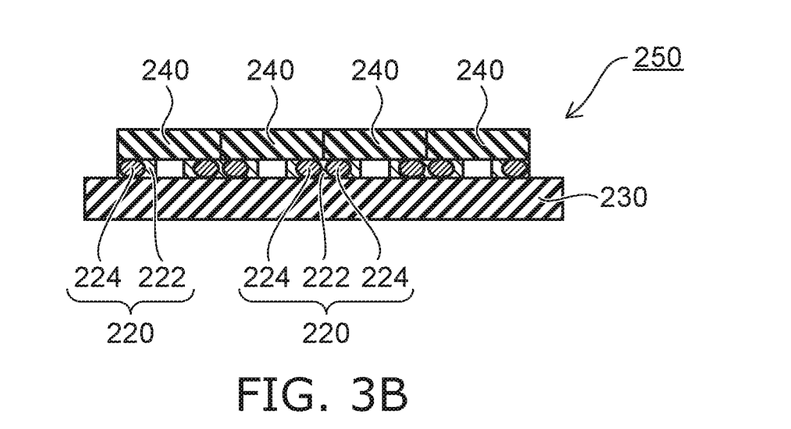
FIG. 3B is a schematic cross-sectional view taken along line IIIB-IIIB' in FIG. 3A.

FIG. 3B is a schematic cross-sectional view taken along line IIIB-IIIB' in FIG. 3A.

As shown in FIGS. 3A and 3B, the light emitting module (i.e., the light source device) 250 includes a mounting substrate 230, bonding layers 220, and a plurality of light emitting elements 240. The bonding layers 220 are provided between the mounting substrate 230 and the plurality of light emitting elements 240 to bond the mounting substrate 230 and the plurality of light emitting elements 240 to each other.

In the present embodiment, the light emitting elements 240 are mounted on the mounting substrate 230 provided with bumps 224, so as to be bonded to the mounting substrate 230 with the bumps 224 and the bonding member 222. Thus, the friction force between the light emitting elements 240 and the bumps 224 can reduce displacement of the light emitting elements 240 after mounting. Accordingly, the mounting precision of the light emitting elements 240 relative to the mounting substrate 230 may be improved, to thereby allow the plurality of light emitting elements 240 to be mounted on the mounting substrate 230 at smaller intervals. The total area of the portions where the bumps 224 are provided is preferably 5% or less than the total area of the light emitting elements 240 as seen in a top view. This may ensure bonding strength while reducing costs.

The light emitting elements 240 are mounted on a mounting region 232 of the mounting substrate 230. The mounting region 232 has a shape corresponding to projection of the light emitting elements 240 disposed on the mounting substrate 230. In this example, four light emitting elements 240 are arranged in line and, therefore, the mounting region 232 has a rectangular shape corresponding to the four light emitting elements 240. The mounting region 232 is provided with lands corresponding to the anode terminals and the cathode terminals of the light emitting elements 240. The anode terminals and the cathode terminals of the light emitting elements 240 are electrically connected to other electric circuit via the lands. In this example, in the direction in which the four light emitting elements 240 are arranged, the lands corresponding to the anode terminals and the land corresponding to the cathode terminal are arranged. The lands are connected to each other according to the connection to the light emitting elements 240 and to other circuit.

The bonding layers 220 are respectively formed according to the shape of the anode terminals of the light emitting elements 240 and the shape of the lands respectively corresponding to the anode terminals. Similarly, the bonding layers 220 are respectively formed according to the shape of the cathode terminals of the light emitting elements 240 and the shape of the lands respectively corresponding to the cathode terminal. In this example, the four light emitting elements 240 are connected in series and, therefore, the bonding layer formed for the cathode terminal of one light emitting element 240 and corresponding land is continuous and electrically connected to the bonding layer formed for the anode terminal of the adjacent light emitting element 240 and corresponding land.

The bumps 224 are preferably disposed at the outer edge of each of the plurality of light emitting elements 240. As in the present embodiment, further preferably, the bumps 224 are respectively disposed at the corners of each light emitting element 240 as seen in a top view. When the size of each light emitting element 240 is great as seen in a top view, the bump 224 can additionally be provided at the intersection point of diagonals of each light emitting element as in other embodiment described above. Disposing a multitude of bumps below the light emitting element can reduce tilting of the light emitting element in mounting due to dimensional variance of the bumps or the like. This can ensure mounting precision. As in other embodiment, the bumps 224 are formed of a metal material of which melting point is sufficiently higher than that of the bonding members 222 configuring the bonding layers 220. Examples of the metal material include a metal material contains Ag.

On the mounting substrate 230, the light emitting elements 240 are provided via the bonding layers 220. The light emitting elements 240 are directly connected to the mounting substrate 230 with the bonding layers 220.

The bonding layers 220 each include the bonding member 222 and the bumps 224. The bonding member 222 is provided to fill the space between the mounting substrate 230 and the light emitting elements 240, the space between the mounting substrate 230 and the bumps 224, and the space between the bumps 224 and the light emitting elements 240. Accordingly, the bonding layer 220 is provided in the space among the mounting substrate 230, the bumps 224, and the light emitting elements 240 to fill the space therebetween. Filling such space with the bonding layer 220 can reduce thermal resistance of the light emitting module 250 and can inhibit occurrence of cracks in the bonding layer 220 attributed to thermal stress.

The bonding member 222 has high thermal conductivity and the melting point sufficiently higher than the operating temperature range and the storage temperature range of the light emitting module 250. For example, the bonding member 222 contains Au—Sn eutectic alloy.

When the bonding member 222 is Au—Sn eutectic alloy, the thickness of the bonding layer 220 is preferably 35 μm or more. The bonding layer 220 having 35 μm or more of thickness can achieve the bonding strength sufficient to withstand the temperature cycle test condition of −40° C. to +125° C. which is required in industrial or automotive applications.

The bonding layers 220 bond between the mounting substrate 230 and the light emitting elements 240, and withstand the stress attributed to the difference in coefficient of linear expansion between the two types of members. The bonding layers 220 containing Au—Sn and having a sufficient thickness can ensure the bonding strength with less occurrence of cracks due to stress attributed to the difference in coefficient of linear expansion between the two types of members.

A description will be given of a method of manufacturing the light emitting module 250 according to the present embodiment.

FIGS. 4A to 4E are each a schematic cross-sectional view exemplarily showing the method of manufacturing the light emitting module according to the present embodiment.

Figure 4A:
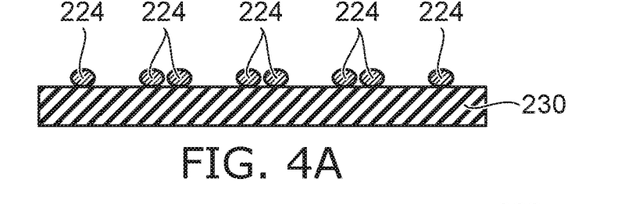
FIG. 4A is a schematic cross-sectional view exemplarily showing a method of manufacturing the light emitting module according to the second embodiment.

As shown in FIG. 4A, the bumps 224 are formed on the mounting substrate 230. In the following, a description will be given of the manufacturing method of a process in which the bumps 224 configured as Ag bumps and formed at the four corners of each of the light emitting elements 240 as seen in a top view.

Figure 4B:
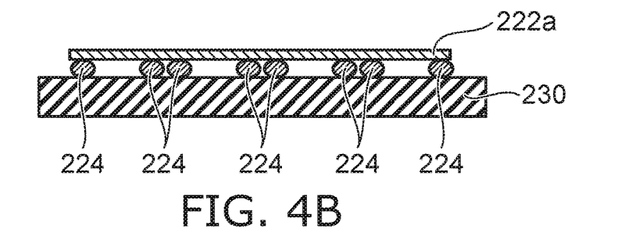
FIG. 4B is a schematic cross-sectional view exemplarily showing the method of manufacturing the light emitting module according to the second embodiment.

As shown in FIG. 4B, an Au—Sn foil 222a is disposed so as to cover all the bumps 224. The Au—Sn foil 222a is disposed having its four corners aligned with the bumps 224 disposed at the four corners of the mounting region 232. The Au—Sn foil 222a has a quadrangular shape which is substantially the same as the shape of the mounting region for the light emitting elements 240 as seen in a top view.

Figure 4C:
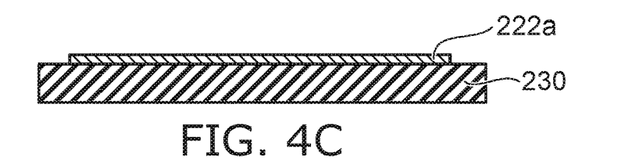
FIG. 4C is a schematic cross-sectional view exemplarily showing the method of manufacturing the light emitting module according to the second embodiment.

Alternatively, as shown in FIG. 4C, the Au—Sn foil 222a having a rectangular shape which is substantially the same as the shape of the mounting region can be disposed on the mounting substrate 230. In this case, the bumps are previously formed on the light emitting element side.

Figure 4D:
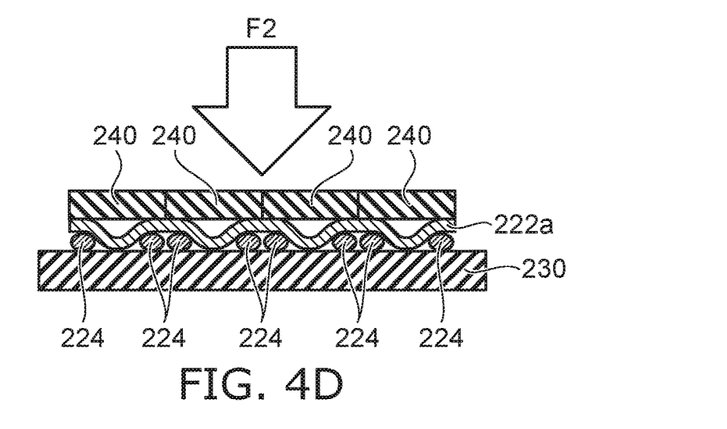
FIG. 4D is a schematic cross-sectional view exemplarily showing the method of manufacturing the light emitting module according to the second embodiment.

As shown in FIG. 4D, the light emitting elements 240 are mounted on the Au—Sn foil 222a as seen in a top view. The light emitting elements 240 are mounted successively from the end one of the light emitting elements 240, for example. The light emitting elements 240 are mounted so as to be aligned with the bumps 224. While pressure F2 is applied from the top of the light emitting element 240, heat is applied to the whole structure to high temperatures. Similarly to the first embodiment, the heating temperature is set according to the composition of the Au—Sn eutectic alloy of the Au—Sn foil 222a and the melting point of the bumps 224. For example, the set temperature is preferably in a range of 280° C. to 350° C. when the Au—Sn eutectic alloy is composed of 20 wt % of Sn.

The Au—Sn foil 222a is melted at a temperature equal to or higher than the melting point of the Au—Sn foil 222a, and then fill the space around the bumps 224 and the space between the light emitting elements 240 and the Au—Sn foil 222a. The pressure F2 is applied to push out the air in the space existing around the bumps 224 and the space between the light emitting elements 240 and the Au—Sn foil 222a as a result of the melting of the Au—Sn foil 222a, to thereby inhibit generation of voids.

Figure 4E:
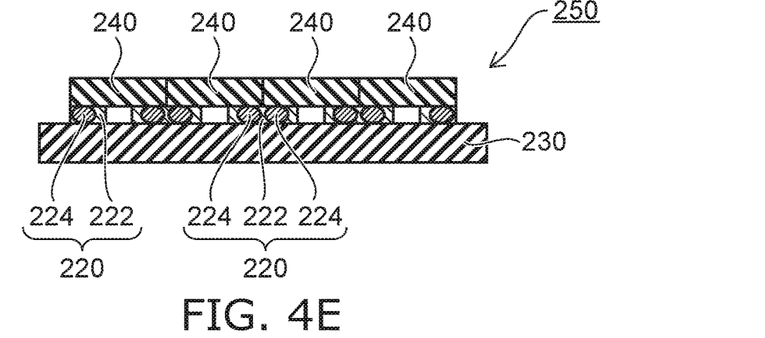
FIG. 4E is a schematic cross-sectional view exemplarily showing the method of manufacturing the light emitting module of the second embodiment.

As shown in FIG. 4E, the melted Au—Sn foil 222a bonds the anode terminals of respective light emitting elements 240 to the lands on the mounting region 232 corresponding to that anode terminals by wettability. Similarly, the Au—Sn foil 222a bonds the cathode terminals of respective light emitting elements 240 to the lands on the mounting region 232 corresponding to that cathode terminals.

The mounting substrate 230, the bonding member 222, the bumps 224, and the light emitting elements 240 are cooled, whereby the melted bonding part form the bonding layers 220. Thus, the mounting substrate 230 and the light emitting elements 240 are connected to each other.

In the light emitting module 250 according to the present embodiment, the bonding layer 220 can have a sufficient thickness by virtue of the bumps 224 being provided between the mounting substrate 230 and the light emitting elements 240. This can sufficiently improve the bonding strength between the mounting substrate 230 and the light emitting elements 240.

In the present embodiment, the light emitting elements 240 are connected to the mounting substrate 230 with the bumps 224 and the bonding member 222. Therefore, the mounting precision can be improved, and the light emitting elements 240 are allowed to be mounted at narrower intervals.

Third Embodiment

Figure 5A:
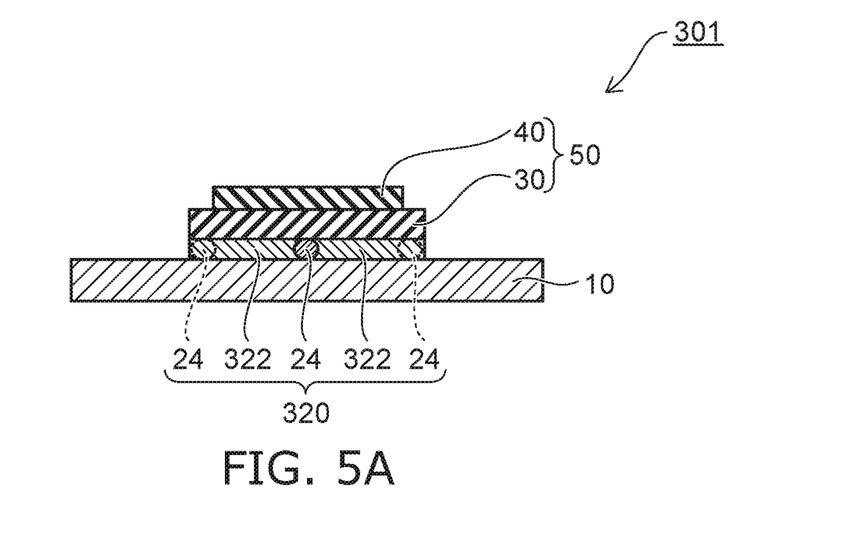
FIG. 5A is a schematic cross-sectional view exemplarily showing a light source module according to a third embodiment.

FIG. 5A is a schematic cross-sectional view exemplarily showing a light source module according to the present embodiment.

Figure 5B:
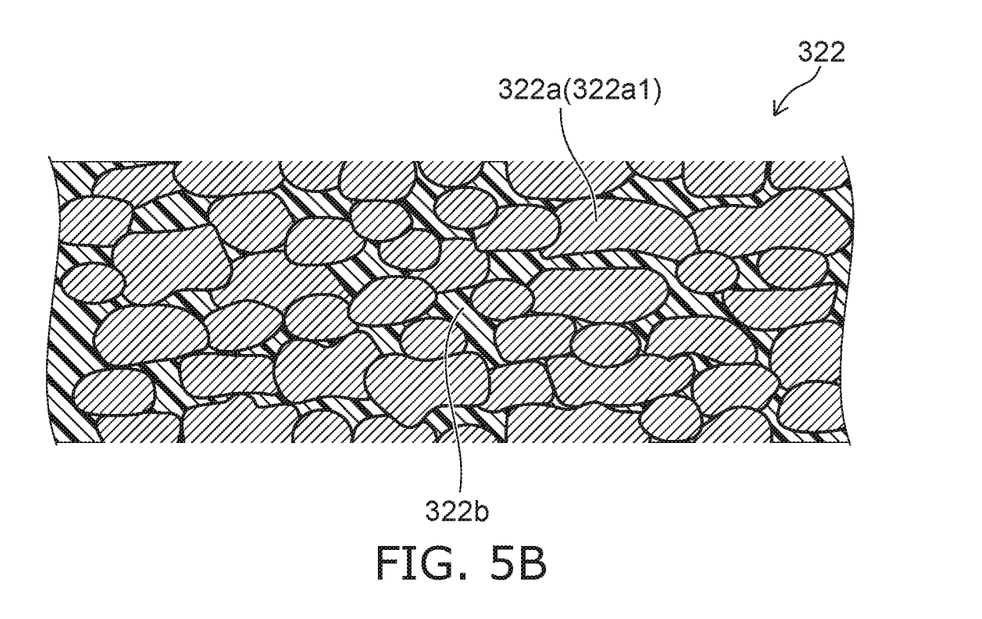
FIG. 5B is a schematic enlarged cross-sectional view exemplarily showing part of the light source module in FIG. 5A.

FIG. 5B is a schematic enlarged cross-sectional view exemplarily showing the light source module of FIG. 5A.

As shown in FIGS. 5A and 5B, the light source module 301 according to the present embodiment includes the module substrate 10, a bonding layer 320, and the light emitting module 50. The light source module 301 according to the present embodiment is different from other above-described embodiments in the configuration of the bonding layer 320. In the following, an identical constituent is denoted by an identical reference numeral, and the detailed description thereof will be omitted as appropriate.

In the light emitting module 50, the light emitting element 40 is provided on the mounting substrate 30. The bonding layer 320 is provided between the module substrate 10 and the mounting substrate 30.

The bonding layer 320 includes a bonding member 322 and bumps 24. The bumps (i.e., a third portion) 24 contains a first metal. The first metal contains, for example, at least one type of metal selected from the group consisting of Au, Ag, and Cu.

The bonding member (i.e., a fourth portion) 322 includes a metal portion 322a and a resin portion 322b. The metal portion 322a is formed of a plurality of particles of metal powder 322a1 being linked to each other. The metal portion 322a contains metal, and can be configured as, for example, pure metal. The metal portion 322a contains, for example, at least one type of metal selected from the group consisting of Au, Ag, and Cu. The metal of the metal portion 322a can be identical to or different from that of the bumps 24.

The resin portion 322b includes a resin material. Part of the resin portion 322b is positioned among the metal powder 322a1. The resin material is thermosetting resin as will be described later, and epoxy resin for example.

The bonding member 322 can include one or more portions where the resin portion 322b is absent. Air gap can be formed at the portions where the resin portion 322b is absent among the metal powder 322a1.

The bonding member 322b is configured as, for example, heating what is called Ag paste in which Ag particles are dispersing in a resin binder. In this case, the bumps 24 can contain, for example, Ag.

A description will be given of a method of forming the bonding member 322 according to the present embodiment.

Figure 6A:
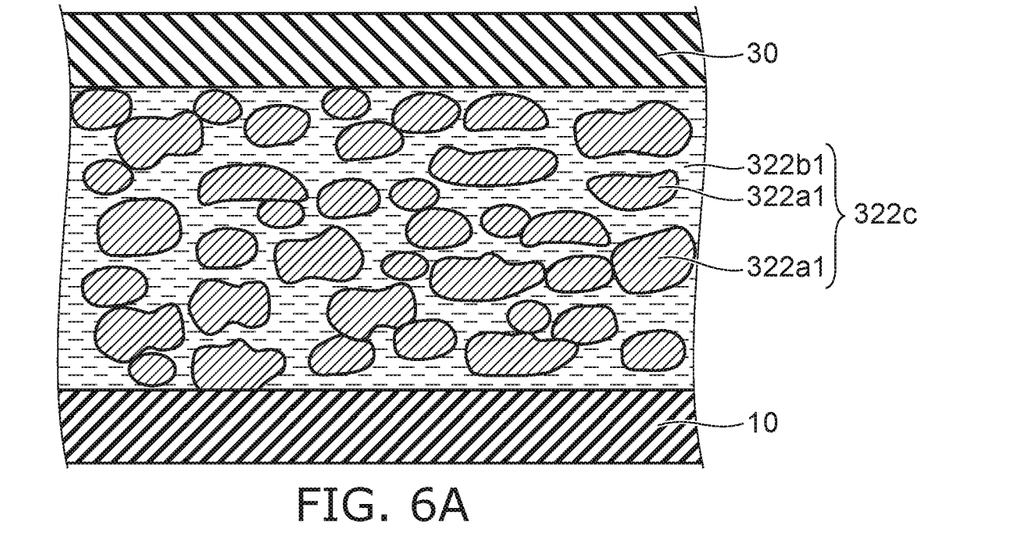
FIG. 6A is a schematic cross-sectional view exemplarily showing a method of forming a bonding member according to the third embodiment.

FIG. 6A is a schematic cross-sectional view exemplarily showing a method of forming a bonding member according to the present embodiment.

Figure 6B:
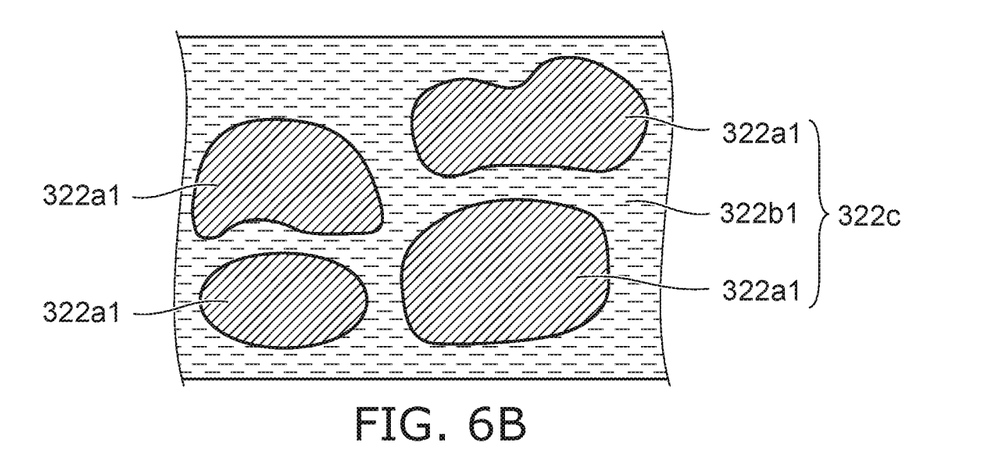
FIG. 6B is a schematic cross-sectional view showing a partial enlarged view of FIG. 6A.

FIG. 6B is a schematic cross-sectional view showing a partial enlarged view of FIG. 6A.

Figure 7A:
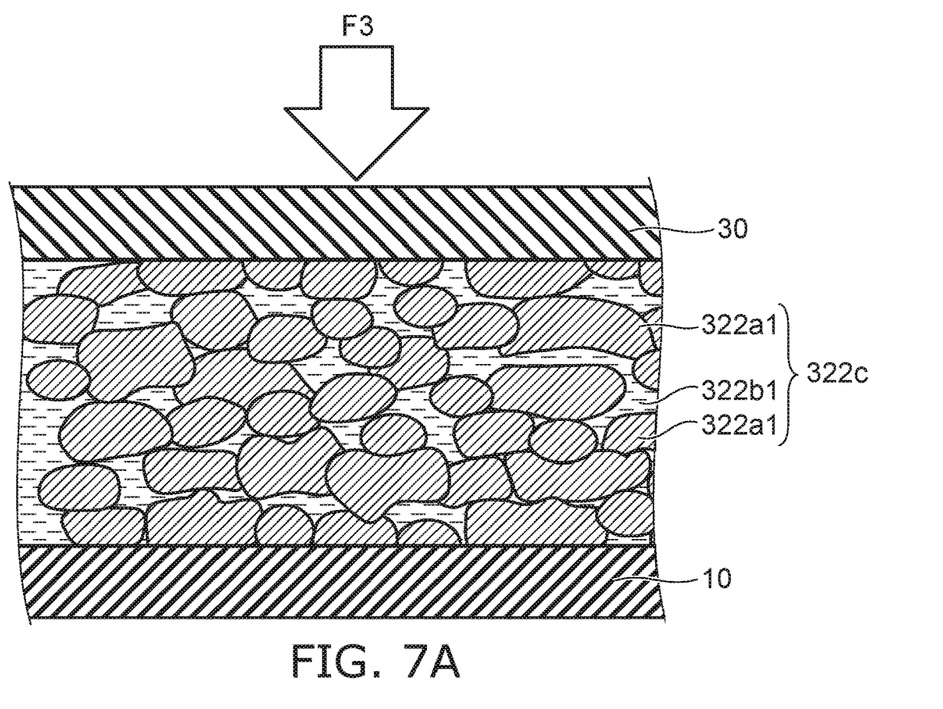
FIG. 7A is a schematic cross-sectional view exemplarily showing a method of forming a bonding member according to the third embodiment.

FIG. 7A is a schematic cross-sectional view exemplarily showing a method of forming a bonding member according to the present embodiment.

Figure 7B:
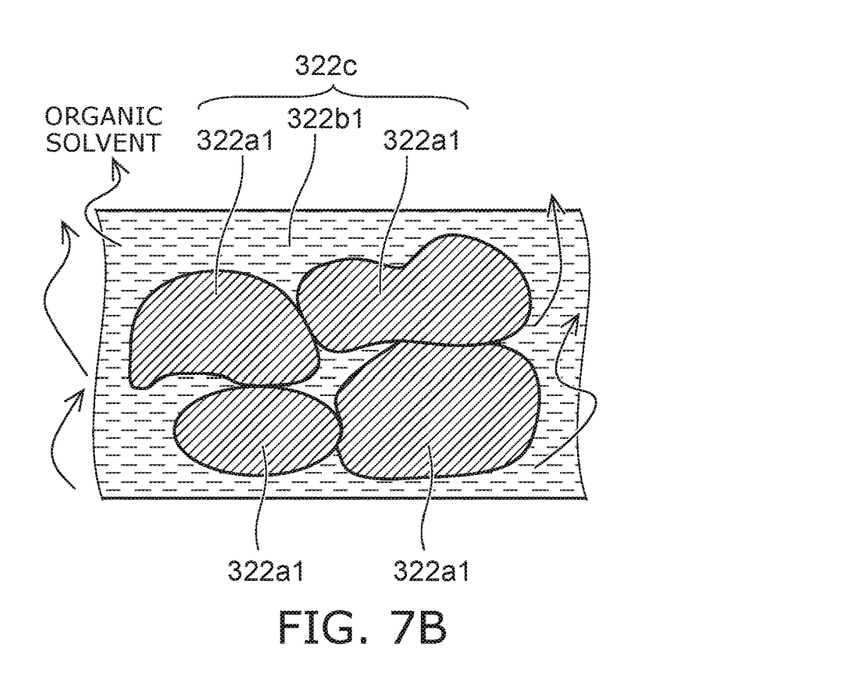
FIG. 7B is a schematic cross-sectional view showing a partial enlarged view of FIG. 7A.

FIG. 7B is a schematic cross-sectional view showing a partial enlarged view of FIG. 7A.

Figure 8A:
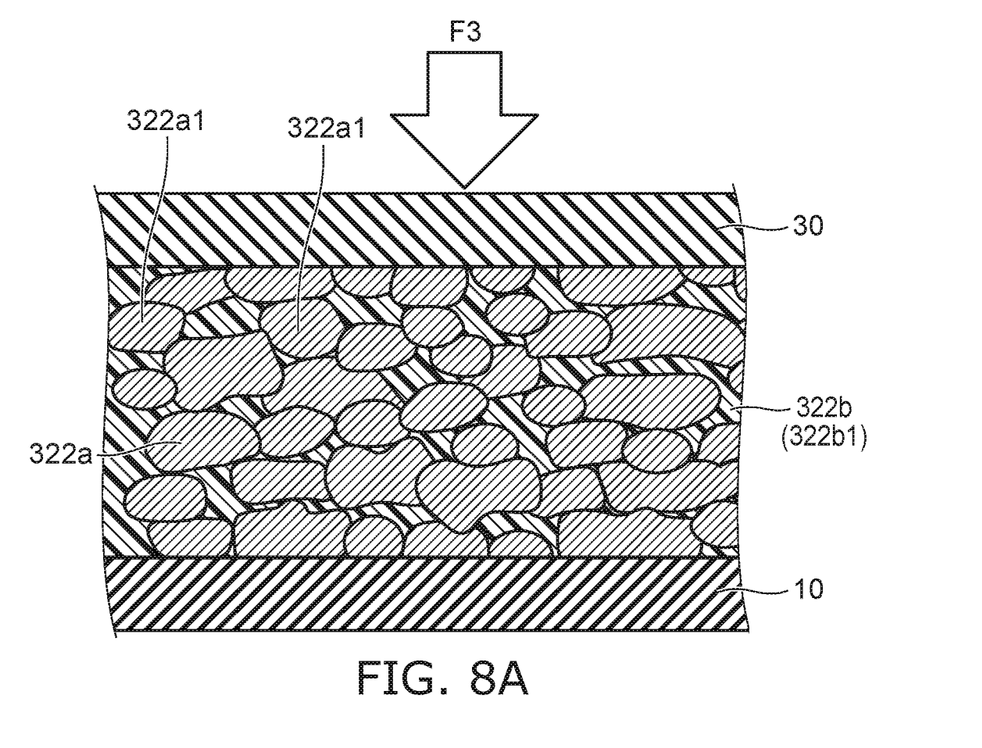
FIG. 8A is a schematic cross-sectional view exemplarily showing a method of forming a bonding member according to the third embodiment.

FIG. 8A is a schematic cross-sectional view exemplarily showing a method of forming a bonding member according to the present embodiment.

Figure 8B:
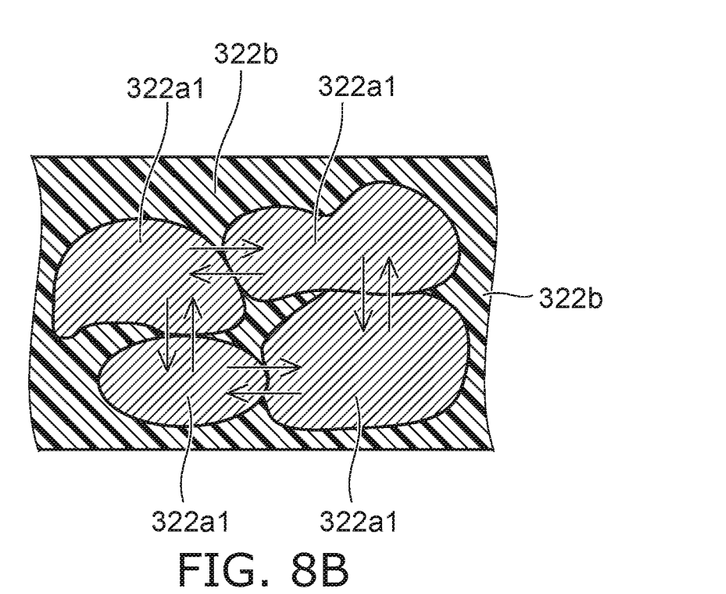
FIG. 8B is a schematic cross-sectional view showing a partial enlarged view of FIG. 8A.

FIG. 8B is a schematic cross-sectional view showing a partial enlarged view of FIG. 8A.

Figure 9A:
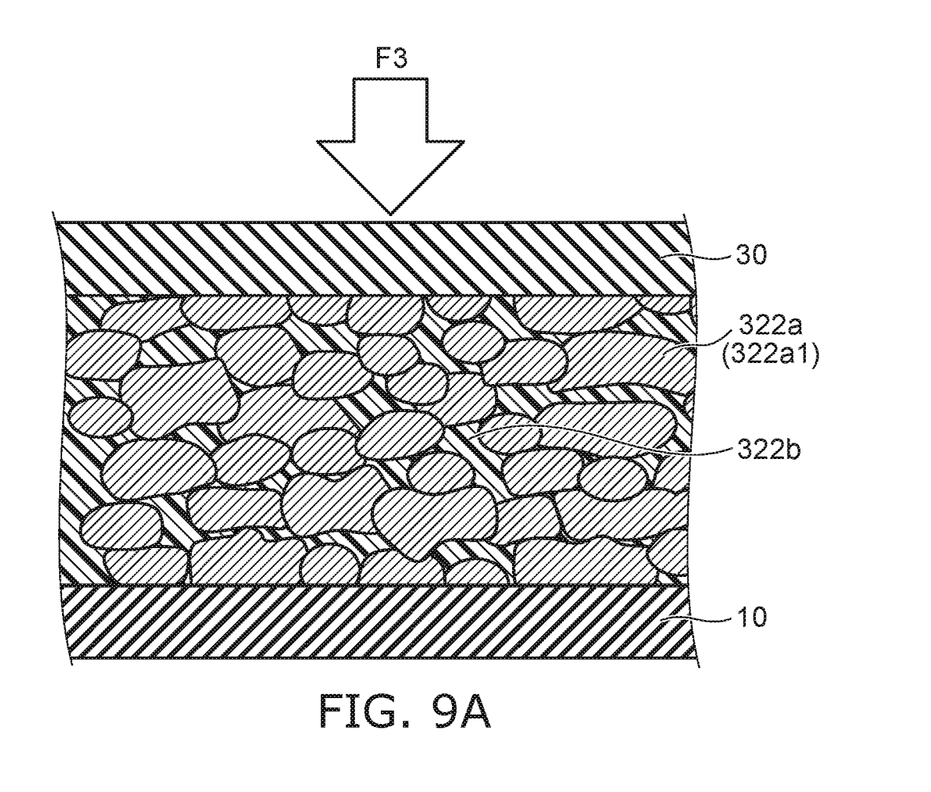
FIG. 9A is a schematic cross-sectional view exemplarily showing a method of forming a bonding member according to the third embodiment.

FIG. 9A is a schematic cross-sectional view exemplarily showing a method of forming a bonding member according to the present embodiment.

Figure 9B:
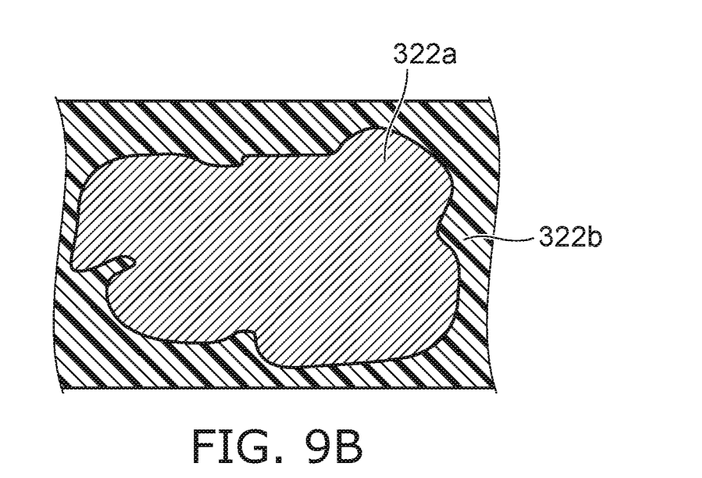
FIG. 9B is a schematic cross-sectional view showing a partial enlarged view of FIG. 9A.

FIG. 9B is a schematic cross-sectional view showing a partial enlarged view of FIG. 9A.

As shown in FIGS. 6A and 6B, what is provided is paste (i.e., the bonding member) 322c in which metal powder 322a1 is dispersed in a resin liquid 322b1. Onto the module substrate 10 on which the bumps are disposed, the paste 322c is applied. As has been described above with reference to FIG. 2A, the module substrate 10 on which the bumps are disposed is provided. The position and height of the bumps are substantially the same as those described in other above-described embodiments.

The paste 322c can be applied onto the mounting substrate 30 side, instead of being applied onto the module substrate 10 side. Alternatively, the paste 322c can be applied onto both of the module substrate 10 and the mounting substrate 30. The paste 322c is, for example, what is called Ag paste in which Ag particles are dispersed in a resin binder.

The resin liquid 322b1 of the paste 322c contains a resin material and an organic solvent. The metal powder 322a1 contains metal, and is formed of, for example, pure metal, and contains, for example, at least one type of metal selected from the group consisting of Au, Ag, and Cu. The particle size of the metal powder 322a1 is, for example, 1 μm or less, preferably 500 nm or less, and further preferably 100 nm or less. The smaller particle size facilitates sintering of the metal particles. In the applied paste 322c, the metal powder 322a1 is substantially evenly dispersed in the resin liquid 322b1.

As shown in FIGS. 7A, 7B, 8A, and 8B, the organic solvent in the paste 322c is evaporated and the resin material in the paste 322c is cured. For example, pressure F3 is applied from the mounting substrate 30 side of the structure formed using the module substrate 10 onto which the paste 322c is applied and the mounting substrate 30, while applying heat to the structure to a temperature of 200° C. or lower. The pressure and heat remove the organic solvent from the resin liquid 322b1, whereby the particles of the metal powder 322a1 are brought into contact with each other. Thus, the resin material in the resin liquid 322b1 cures, and the solid resin portion 322b is formed. Simultaneously, the metal diffuses among the particles of the metal powder 322a1 via contact portions between the particles of the metal powder 322a1.

As shown in FIGS. 9A and 9B, the metal powder 322a1 is sintered. For example, pressure F3 is applied from the mounting substrate 30 side of the structure formed using the metal powder 322a1, the resin portion 322b, the module substrate 10, and the mounting substrate 30, while applying heat to the structure to a temperature lower than the melting point of the metal powder 322a1, for example, a temperature in a range of 180° C. to 250° C. inclusive. Thus, the particles of the metal powder 322a1 are sintered with each other, to thereby form the metal portion 322a. At this time, part of the resin portion 322b remains among the particles of the metal powder 322a1. In this manner, the bonding member 322 is formed, whereby the module substrate 10 and the mounting substrate 30 are bonded to each other.

The processes shown in FIGS. 7A to 9B can be continuously performed as a series of processes. For example, the bonding member 322 is formed by gradually increasing the ambient temperature while maintaining the pressure applied from the mounting substrate 30 side at a constant pressure.

In the light source module 301 according to the present embodiment, the paste 322c containing the metal powder 322a1 contains resin and an organic solvent. This can facilitate application of the paste 322c to members subjected to be bonded, to attain tentative connection between the members subjected to be bonded. That is, this can provide simplified manufacturing processes.

In the present embodiment, the bonding layer 320 can be formed at lower temperatures as compared to the case where an Au—Sn foil is used as the bonding member. This can reduce thermal stress during manufacture which may affect the light emitting element 40 and the like.

In the light source module 301 according to the present embodiment, the metal portion 322a which is a sintered body of condensed metal powder can be provided by the metal powder 322a1 being sintered. Thus, low thermal resistance can be realized.

In the metal portion 322a of the light source module 301 according to the present embodiment, the resin portion 322b and air gap exist among particles of the metal powder 322a1 contained in the metal portion 322a, to thereby absorb stress attributed to temperature stress or the like. This can improve environment resistance related to temperature stress or the like.

Fourth Embodiment

The bonding member according to the third embodiment is applicable to the fourth embodiment.

Figure 10:
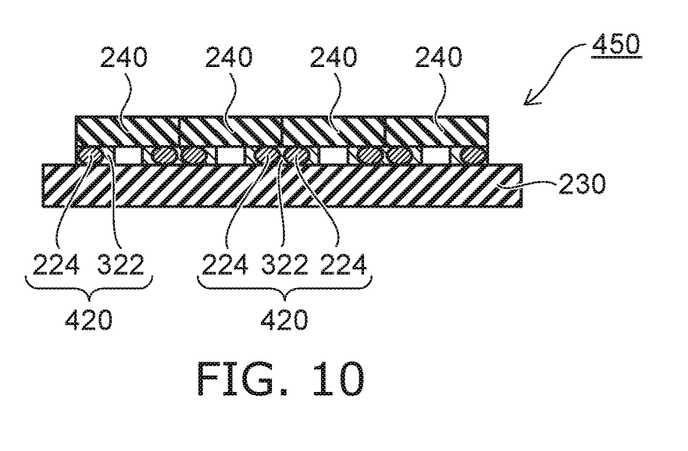
FIG. 10 is a schematic cross-sectional view exemplarily showing a light source module according to a fourth embodiment.

FIG. 10 is a schematic cross-sectional view exemplarily showing a light source module according to the present embodiment.

As shown in FIG. 10, a light emitting module (i.e., light source device) 450 includes the mounting substrate 230, bonding layers 420, and a plurality of light emitting elements 240. The bonding layers 420 are provided between the mounting substrate 230 and the plurality of light emitting elements 240 in order to bond the mounting substrate 230 and the plurality of light emitting elements 240 to each other.

In the present embodiment, the bonding layers 420 are each substantially the same as the bonding layer 420 according to the third embodiment. Each bonding layer 420 includes the bonding member 322 and the bumps 224. As has been described with reference to FIG. 5B, the bonding member 322 includes the metal portion 322a and the resin portion 322b. In this manner, the bonding member 322 is configured substantially the same as the bonding member 322 according to the third embodiment. The configuration other than the bonding member 322 is substantially the same as the second embodiment. That is, in the present embodiment, the light emitting elements 240 are bonded to the mounting substrate 230 with the bonding layers 420.

The bonding layers 420 can be formed similarly to the manner according to the third embodiment.

The embodiments described above can provide the method of manufacturing the light source device with improved bonding strength between the light emitting element and the module substrate, and the light source device therewith.

The foregoing is the description of several embodiments of the present disclosure. The embodiments are of an exemplary nature, and not intended to limit the scope of the invention. These novel embodiments can be carried out in other various situation, and various omissions, replacements, or changes can be made within the spirit of the invention. The embodiments or variations thereof are covered by the scope or spirit of the invention, and the inventive aspects recited in the scope of claims and equivalents thereof. The embodiments can be carried out in any combination.

What is claimed is:
1. A light source device comprising:
a first substrate which is thermally conductive;
a light emitting element; and
a bonding layer provided to fill space between the first substrate and the light emitting element, wherein
the bonding layer has a thickness of 35 μm or more and includes:
  a first portion which comprises a bump containing Ag in a concentration higher than any other metal; and
  a second portion which is an Au—Sn alloy that contains Au in an amount of at least 70 wt % and Sn in an amount of at least 15 wt %,
wherein the first portion is surrounded by the second portion and the first portion has a melting point higher than the second portion.

2. The light source device according to claim 1, wherein the first portion is disposed at least at an outer edge of the bonding layer and a center of the bonding layer as seen in a top view.

3. The light source device according to claim 2, wherein the bonding layer has a quadrangular shape as seen in a top view, and
the first portion is disposed at least at corners of the bonding member and an intersection point of diagonals of the bonding member.

4. The light source device according to claim 1, further comprising a second substrate which is insulative and provided between the light emitting element and the bonding layer.

5. The light source device according to claim 1, wherein the first portion comprising a bump has one of a ball-like shape and a cylindrical shape.

6. The light source device according to claim 5, wherein a height of the first portion is in a range of 35 μm to 50 μm.

7. A light source device comprising
a first substrate which is thermally conductive;
a light emitting element; and
a bonding layer provided to fill space between the first substrate and the light emitting element, wherein
the bonding layer is formed using an alloy containing Ag, Au, and Sn, and includes a bump containing Ag in a concentration higher than Au or Sn, and a portion surrounding the bump where Ag is lower in concentration than Au or Sn, and
the bonding layer has a thickness of 35 μm or more.

* * * * *